(12) United States Patent
Ueno et al.

(10) Patent No.: US 10,672,635 B2
(45) Date of Patent: Jun. 2, 2020

(54) SEMICONDUCTOR-MANUFACTURING APPARATUS AND METHOD FOR MANUFACTURING SEMICONDUCTOR DEVICE

(71) Applicant: Mitsubishi Electric Corporation, Tokyo (JP)

(72) Inventors: Ryuji Ueno, Tokyo (JP); Masatoshi Sunamoto, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 16/208,661

(22) Filed: Dec. 4, 2018

(65) Prior Publication Data
US 2019/0267256 A1    Aug. 29, 2019

(30) Foreign Application Priority Data
Feb. 26, 2018   (JP) .................................. 2018-031785

(51) Int. Cl.
| | | |
|---|---|---|
| *C23C 18/16* | (2006.01) | |
| *H01L 21/673* | (2006.01) | |
| *H01L 21/288* | (2006.01) | |
| *C25D 17/00* | (2006.01) | |
| *H01L 21/768* | (2006.01) | |

(52) U.S. Cl.
CPC .......... *H01L 21/673* (2013.01); *C23C 18/163* (2013.01); *C25D 17/00* (2013.01); *H01L 21/288* (2013.01); *H01L 21/76841* (2013.01)

(58) Field of Classification Search
CPC ............ C23C 18/1644; C23C 18/1648; C23C 18/1642; C23C 18/1603; C23C 18/163
See application file for complete search history.

(56) References Cited

U.S. PATENT DOCUMENTS

| | | | | |
|---|---|---|---|---|
| 5,865,894 A | * | 2/1999 | Reynolds | C23C 18/1619 118/429 |
| 6,881,437 B2 | * | 4/2005 | Ivanov | H01L 21/67051 427/304 |
| 2008/0149489 A1 | * | 6/2008 | Varadarajan | C23C 18/1619 205/137 |

FOREIGN PATENT DOCUMENTS

JP   2000-129496 A   5/2000

* cited by examiner

*Primary Examiner* — Errol V Fernandes
(74) *Attorney, Agent, or Firm* — Studebaker & Brackett PC

(57) ABSTRACT

Provided is a semiconductor-manufacturing apparatus that forms a plated film having a highly homogeneous thickness on a target surface of a semiconductor wafer through electroless plating. A semiconductor-manufacturing apparatus forms plated films on target surfaces of a plurality of wafers held by a carrier capable of holding the wafers. The semiconductor-manufacturing apparatus includes the following: a rectification mechanism including a rectification plate having a plurality of through-holes, the rectification mechanism being held by the carrier in such a manner that the rectification plate faces the target surface of each wafer; a bath in which a chemical solution for forming each plated film is stored, and in which the carrier, holding the plurality of wafers and the rectification mechanism, is immersed in the chemical solution; and a driver configured to shake the carrier as immersed in the bath with a relative positional relationship between each wafer and the through-holes kept constant.

7 Claims, 10 Drawing Sheets

F I G. 1
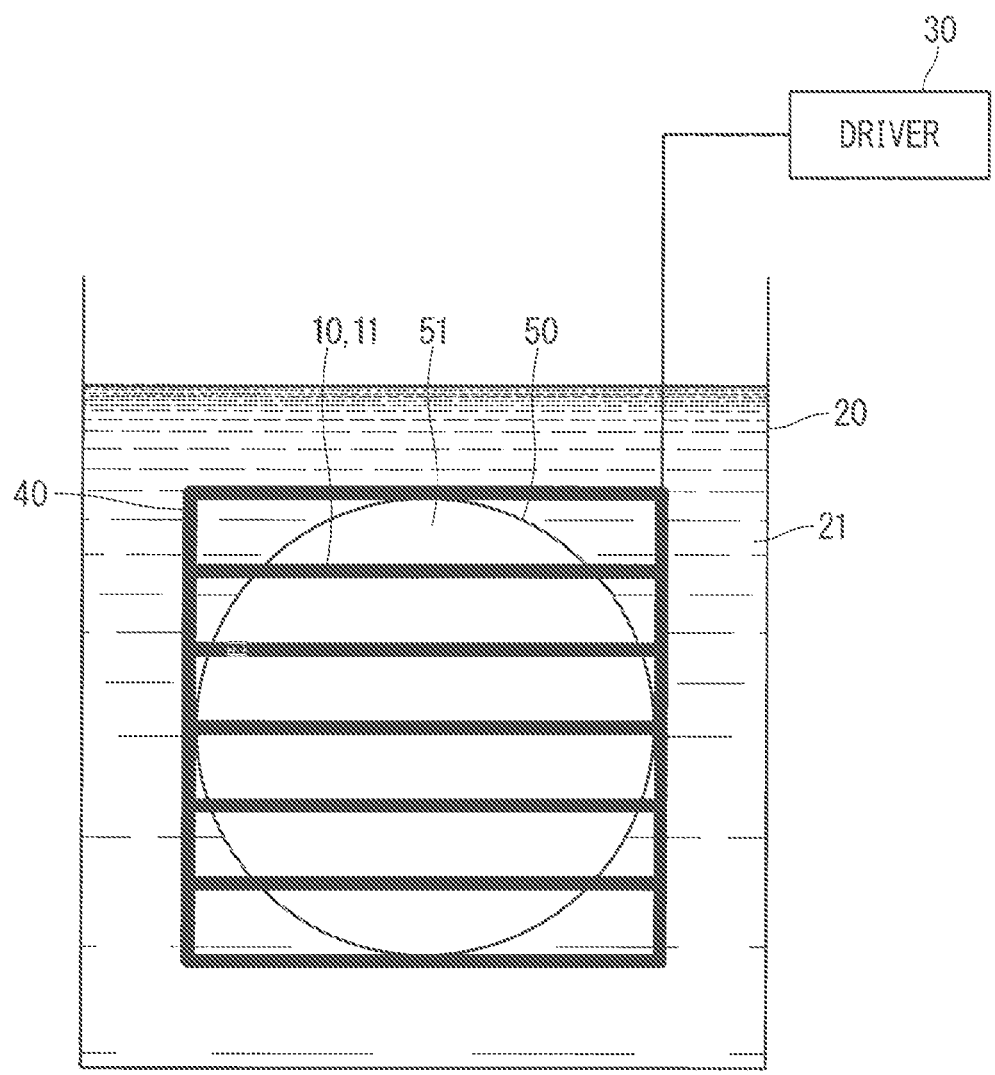

FIG. 2
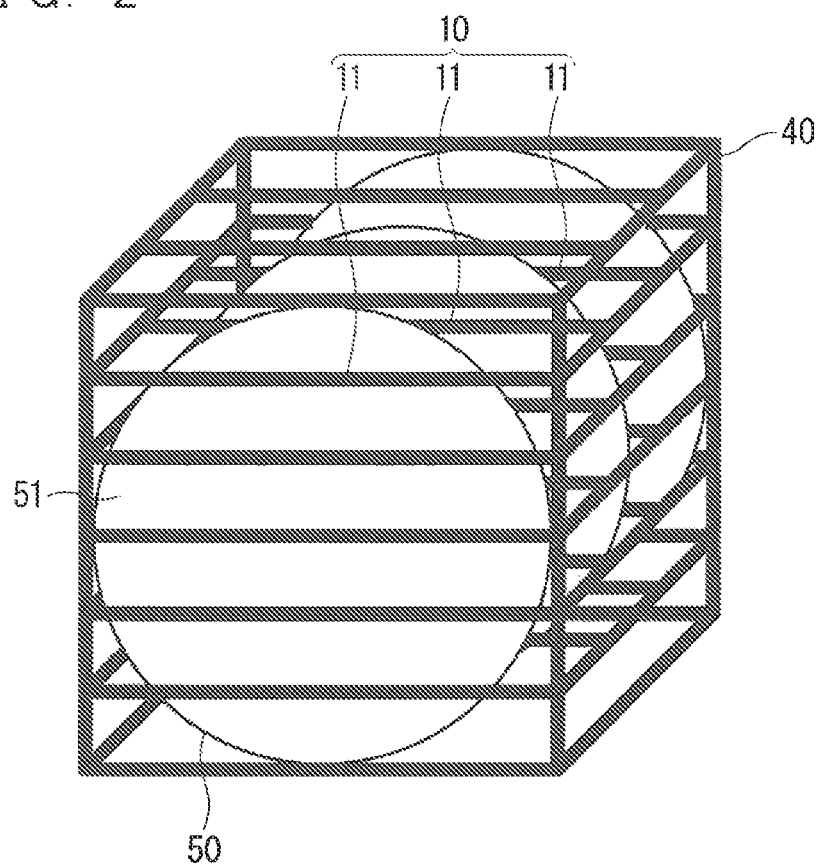
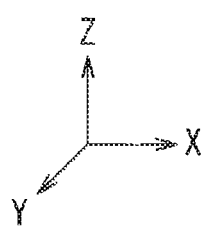
FIG. 3
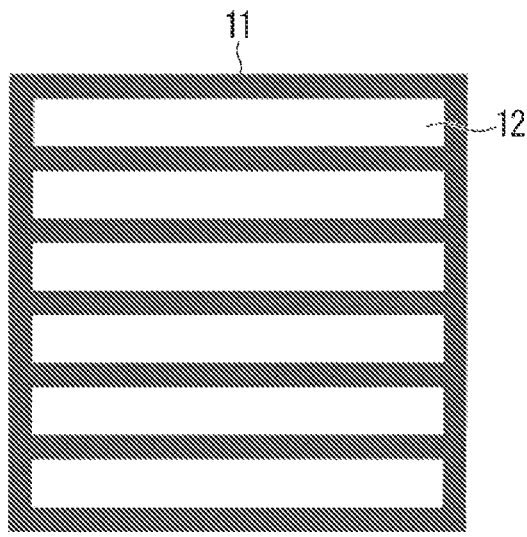

F I G. 1 1

| STEP | CONDITION |
|---|---|
| OXYGEN-PLASMA CLEANING | POWER:800W,O2:100sccm<br>DEGREE OF VACUUM:10Pa,DURATION:60 SECONDS |
| DEGREASING | ALKALINE DEGREASING SOLUTION,pH=9.5,60°C,3 MINUTES |
| ETCHING | ALKALINE ETCHING SOLUTION,pH=9.5,60°C,1 MINUTE |
| ACID CLEANING | ACID CLEANING SOLUTION,25°C,1 MINUTE |
| ZINCATE PROCESS | ALKALINE ZINCATE SOLUTION,25°C,30 SECONDS |
| ZINCATE REMOVAL | NITRIC ACID,25°C,20 SECONDS |
| ZINCATE PROCESS | ALKALINE ZINCATE SOLUTION,25°C,30 SECONDS |
| ELECTROLESS Ni PLATING | ACID ELECTROLESS-Ni-PLATING SOLUTION,pH=5.5,80°C,20 MINUTES,<br>ROTATION SPEED 30rpm |
| ELECTROLESS Au PLATING | NEUTRAL ELECTROLESS-Au-PLATING SOLUTION,pH=7.5,75°C,30 MINUTES |

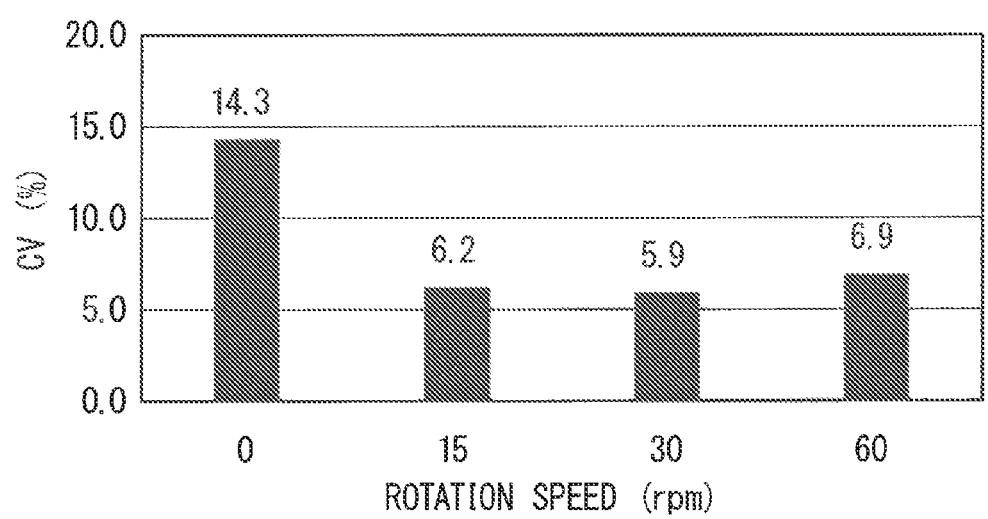
F I G. 1 7

SEMICONDUCTOR-MANUFACTURING APPARATUS AND METHOD FOR MANUFACTURING SEMICONDUCTOR DEVICE

BACKGROUND OF THE INVENTION

Field of the Invention

The present invention relates to a semiconductor-manufacturing apparatus and a method for manufacturing a semiconductor device.

Description of the Background Art

Vertical-conduction semiconductor devices, such as an insulated-gate bipolar transistor (IGBT) and a diode, are disposed on wafers. Such a wafer is thinly processed in order to reduce resistance during energization and improve current-voltage properties. The thickness of the wafer can be reduced to about 50 µm in recent years.

The vertical-conduction semiconductor device includes a back-surface electrode soldered to a circuit substrate, and a front-surface electrode joined to, for instance, an aluminum wire through wire bonding. As such, the vertical-conduction semiconductor device is mounted on the circuit substrate. To save cost or enhance heat dissipation performance, soldering has been recently, growingly used in joining the front-surface electrode and joining the back-surface electrode. For this reason, the front-surface electrode of the semiconductor device needs to be formed of a Ni/Au film that is suitable for soldering. However, soldering reduces the thickness of the Ni film. Accordingly, a thick Ni film needs to be prepared that has a thickness of 2 µm or more. Unfortunately, forming such a thin Ni film through deposition or sputtering increases manufacture cost. In addition, patterning the Ni film formed through deposition or sputtering is difficult. As such, attention is now drawn to electroless plating in forming a Ni film. The Ni film formed through electroless plating saves cost and facilitates patterning.

Forming the Ni film on an electrode containing an Al alloy through electroless plating typically includes a pretreatment through a zincate process. In the electroless plating of Ni through the zincate process, the Al-alloy electrode on a semiconductor wafer undergoes degreasing and pickling. This activates the surface of the Al-alloy electrode. The surface of the Al-alloy electrode then undergoes deposition using Zn, whose standard oxidation-reduction potential is higher than that of Al, to form a thin Zn film. Subsequently, the Zn film undergoes replacement with Ni, followed by self-deposition reaction to form a Ni film.

The above manufacture method includes film formation by immersing the semiconductor wafer placed in a carrier, in bathes containing chemical solutions different from one process to another. The chemical solution contained in the bath for plating the Ni film is stirred for the Ni film to have a highly homogenous thickness (e.g., Japanese Patent Application Laid-Open No. 2000-129496). Recent years increasingly require a high level of homogeneity in thickness. As such, a mere stir of the chemical solution fails to satisfy the required level. A thin semiconductor wafer particularly involves warpage resulting from a stress inside a plated film. Accordingly, a thin plated film needs to be formed so as to have a homogeneous thickness.

Japanese Patent Application Laid-Open No. 2000-129496 discloses electroplating in which a plated film is formed with a stirrer between an anode and a cathode being shaken. The disclosed technique, which relates to electroplating, is inapplicable to electroless plating, different from the electroplating.

In electroless plating, a single carrier holding a plurality of semiconductor wafers (e.g., 25 semiconductor wafers) is immersed in a bath containing a chemical solution in such a manner that each wafer is perpendicular to the surface of the solution. As such, electroless plating enables multi-wafer processing with low-cost facilities, and achieves high productivity. Unfortunately, the technique disclosed in Japanese Patent Application Laid-Open No. 2000-129496 fails to achieve high productivity. In addition, this technique requires cost for production facilities when applied to multi-wafer processing.

In electroless plating, a non-purified target surface hinders a replacement reaction, thus reducing the homogeneity of film thickness or adhesion, and further causing a failure in plated-film deposition.

As described above, stably forming a plated film having a highly homogeneous thickness through electroless plating is difficult in the technique disclosed in Japanese Patent Application Laid-Open No. 2000-129496.

SUMMARY

It is an object of the Specification to provide a semiconductor-manufacturing apparatus that forms a plated film having a highly homogeneous thickness on a target surface of a semiconductor wafer through electroless plating.

A semiconductor-manufacturing apparatus in the Specification forms plated films on target surfaces of a plurality of wafers held by a carrier capable of holding the plurality of wafers. The semiconductor-manufacturing apparatus includes the following: a rectification mechanism including a rectification plate having a plurality of through-holes, the rectification mechanism being held by the carrier in such a manner that the rectification plate faces the target surface of each wafer; a bath in which a chemical solution for forming each plated film is stored, and in which the carrier, holding the plurality of wafers and the rectification mechanism, is immersed in the chemical solution; and a driver configured to shake the carrier as immersed in the bath with a relative positional relationship between each wafer and the plurality of through-holes kept constant.

The Specification provides the semiconductor-manufacturing apparatus that forms the plated film having a highly homogeneous thickness on the target surface of the semiconductor wafer through electroless plating.

These and other objects, features, aspects and advantages of the present invention will become more apparent from the following detailed description of the present invention when taken in conjunction with the accompanying drawings.

BRIEF DESCRIPTION OF THE DRAWINGS

FIG. 1 is a diagram of the configuration of a semiconductor-manufacturing apparatus according to a first preferred embodiment;

FIG. 2 is a diagram of the configuration of a rectification mechanism and a carrier according to the first preferred embodiment;

FIG. 3 is a diagram of the configuration of a rectification plate according to the first preferred embodiment;

FIG. 11 is a table showing a process condition according to the first preferred embodiment;

FIG. 17 is a graph showing a relationship between the rotation speed of shaking and the thickness homogeneity of a plated film, according to a second preferred embodiment.

DESCRIPTION OF THE PREFERRED EMBODIMENTS

First Preferred Embodiment

Figure 4:
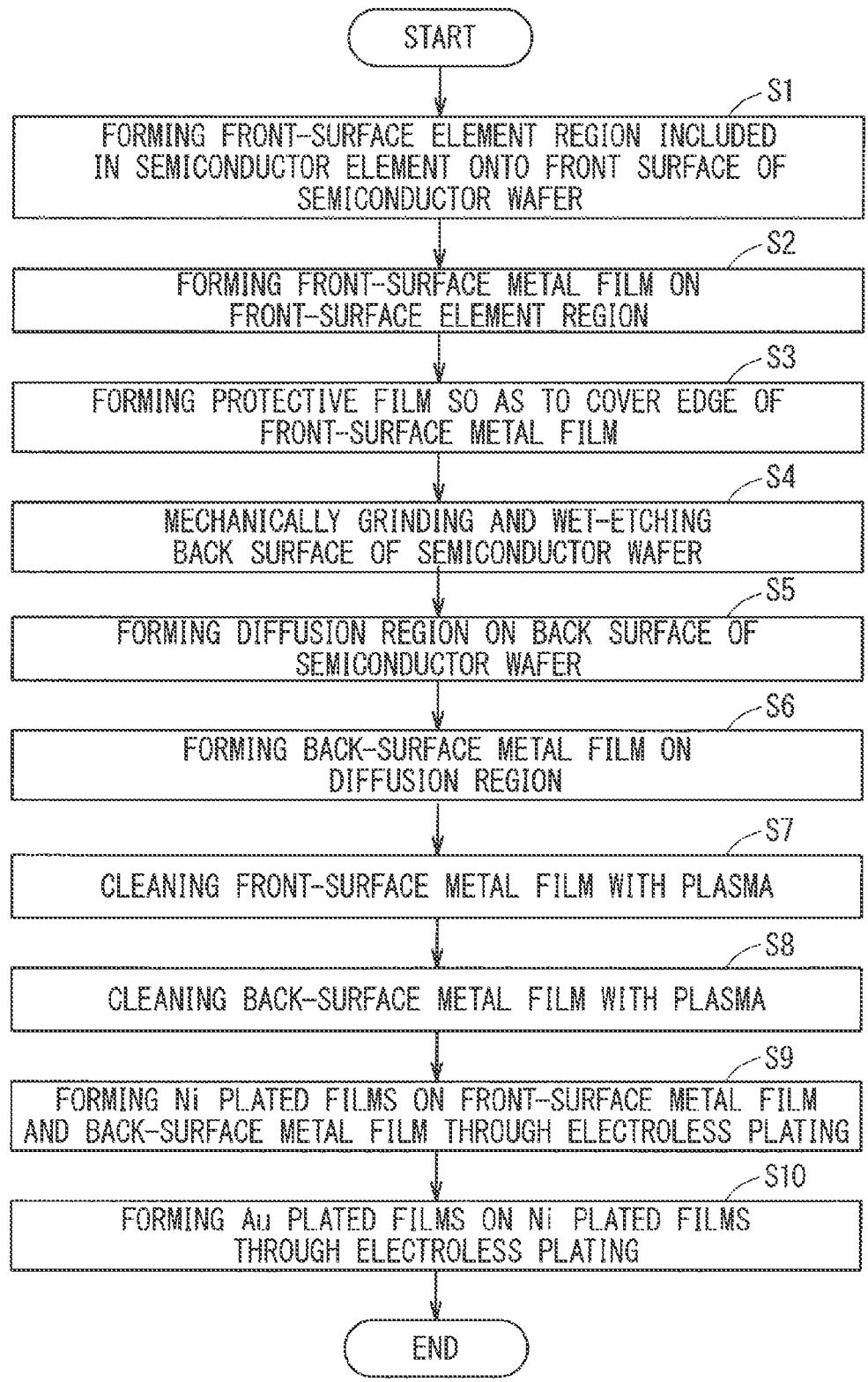
FIG. 4 is a flowchart showing a method for manufacturing a semiconductor device according to the first preferred embodiment.

FIG. 1 is a diagram of the configuration of a semiconductor-manufacturing apparatus according to a first preferred embodiment. The semiconductor-manufacturing apparatus includes a rectification mechanism 10, a bath 20, and a driver 30. The semiconductor-manufacturing apparatus forms a plated film on a target surface 51 of each of a plurality of semiconductor wafers 50 held by a carrier 40. FIG. 2 is a diagram of the configuration of the rectification mechanism 10 and carrier 40.

The rectification mechanism 10 includes rectification plates 11 and is held by the carrier 40. FIG. 3 is a diagram of the configuration of each rectification plate 11. The rectification plate 11 has a plurality of through-holes 12. In the first preferred embodiment, each through-hole 12 is a rectangle, having longer sides in one direction. As illustrated in FIG. 2, the rectification plate 11 has a configuration in which the through-holes 12 and regions without the through-holes 12 are alternately arranged, in the plane of the target surface 51 of each semiconductor wafer 50. Further, the rectification plate 11 faces the target surface 51 of each semiconductor wafer 50. The distance between the regions without the through-holes 12 and the target surface 51 of the semiconductor wafer 50 is preferably constant in the plane of the semiconductor wafer 50. That is, the semiconductor wafer 50 is preferably parallel with the rectification plate 11, facing the target surface 51. Each semiconductor wafer 50 and the rectification mechanism 10 are held by the carrier 40 in such a manner that the semiconductor wafer 50 and each through-hole 12 establish a constant, relative positional relationship. The rectification mechanism 10 in the first preferred embodiment is integrated with the carrier 40.

As illustrated in FIG. 1, the bath 20 is a container. The bath 20 stores a chemical solution 21 for plated-film formation. The carrier 40, holding the plurality of semiconductor wafers 50 and the rectification mechanism 10, is immersed in the chemical solution 21 in the bath 20.

The driver 30 shakes the carrier 40 as immersed in the bath 20 with the relative positional relationship between each semiconductor wafer 50 and the plurality of through-holes 12 kept constant. The direction of shaking is preferably parallel with the target surface 51 of each semiconductor wafer 50. The direction parallel with the target surface 51 includes one direction and a circumferential direction. As illustrated in FIGS. 1 and 2, the target surface 51 of the semiconductor wafer 50 is parallel with an xz plane. The driver 30 shakes the carrier 40 in the direction parallel with the target surface 51, such as in an x-axis direction or a z-axis direction. Alternatively, the driver 30 shakes the carrier 40 in the direction parallel with the target surface 51, such as in a circumferential direction in the xz plane. That is, the driver 30 shakes the carrier 40 so that the carrier 40 moves in circle. In this case, the driver 30 shakes the carrier 40 in each of the x-axis direction and the z-axis direction. The shaking in the x-axis direction and the shaking in the z-axis direction produce a phase difference.

FIG. 4 is a flowchart showing a method for manufacturing a semiconductor device according to the first preferred embodiment.

Step S1 is forming a front-surface element region included in the semiconductor device onto the front surface of the semiconductor wafer 50. The semiconductor device is formed in a desired region on the semiconductor wafer 50. The semiconductor wafer 50 contains, for instance, Si, SiC, or GaN. The semiconductor device includes a switching element, such as an IGBT or a metal-oxide-semiconductor field-effect transistor (MOSFET).

Figure 5:
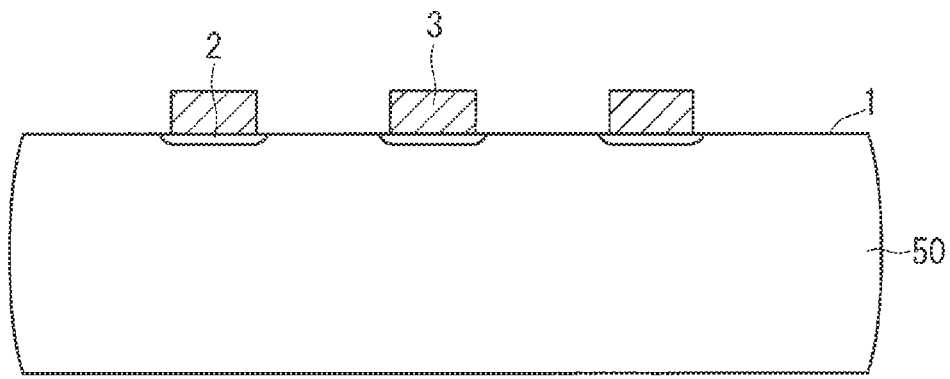
FIG. 5 is a cross-sectional view of the configuration of a semiconductor wafer on which a front-surface element region and a front-surface metal film are formed, according to the first preferred embodiment.

Step S2 is forming a front-surface metal film on the front-surface element region. FIG. 5 is a cross-sectional view of the configuration of the semiconductor wafer 50 having the front-surface element region, 2, and the front-surface metal film, 3, formed on the front surface, 1. The front-surface metal film 3 is, for instance, a front-surface electrode of the semiconductor device. The front-surface metal film 3 contains an Al alloy of, for instance, AlSi, AlCu, AlSiCu, or other Al-containing materials. The front-surface metal film 3 is formed through, for instance, sputtering.

Figure 6:
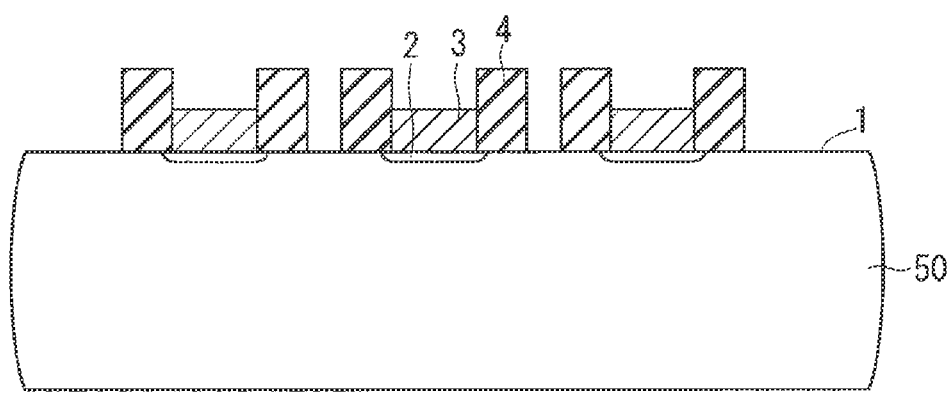
FIG. 6 is a cross-sectional view of the configuration of the semiconductor wafer on which a protective film is formed, according to the first preferred embodiment.

Step S3 is forming a protective film 4 so as to cover the edge of the front-surface metal film 3. FIG. 6 is a cross-sectional view of the configuration of the semiconductor wafer 50 on which the protective film 4 is formed. The protective film 4 contains, for instance, polyimide.

Step S4 is mechanically grinding and wet-etching the back surface of the semiconductor wafer 50. The semiconductor wafer 50 is processed to be thin through the mechanical grinding and wet etching. The wet etching removes a defective layer produced in the mechanical grinding. Removal thickness through the wet etching is 5 to 20 μm.

Step S5 is forming a diffusion region on the back surface of the semiconductor wafer 50.

Figure 7:
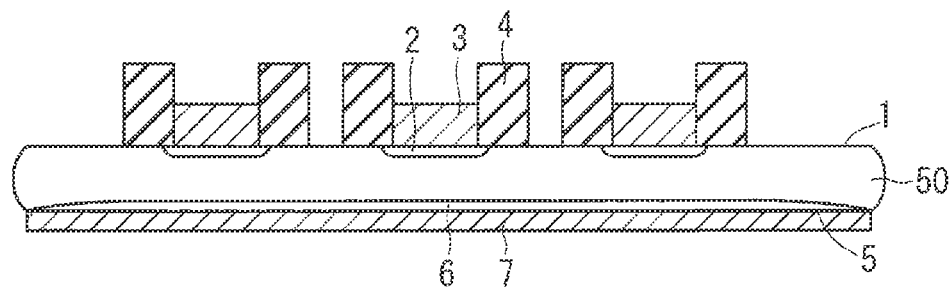
FIG. 7 is a cross-sectional view of the configuration of the semiconductor wafer on which a diffusion region and a back-surface metal film are formed, according to the first preferred embodiment.

Step S6 is forming a back-surface metal film on the diffusion region. FIG. 7 is a cross-sectional view of the configuration of the semiconductor wafer 50 having the diffusion region, 6, and the back-surface metal film, 7, formed on the back surface, 5. The back-surface metal film 7 is, for instance, a back-surface electrode of the semiconductor device. The back-surface metal film 7 contains an Al alloy of, for instance, AlSi, AlCu, AlSiCu, or other Al-containing materials. The back-surface metal film 7 is formed through, for instance, sputtering.

Step S7 is cleaning the front-surface metal film 3 with plasma. The plasma contains oxygen. A residue such as an organic matter firmly adheres to the front surface of the front-surface metal film 3 before cleaning with plasma. In the cleaning with oxygen plasma, the oxygen plasma dissolves, through oxidation, the firmly adhering organic residue that cannot be removed through plating. The cleaning with the oxygen plasma purifies the entire front surface of the front-surface metal film 3. This improves the wettability of the front-surface metal film 3 and promotes a reaction of uniform replacement with a plating solution in a plating process, which will be described later on. Consequently, a plated film is formed that has a highly homogeneous thickness. The plasma in step S7 may include argon.

Step S8 is cleaning the back-surface metal film 7 with plasma. The back-surface metal film 7 undergoes cleaning with oxygen plasma as well, in order to achieve a similar effect.

Figure 8:
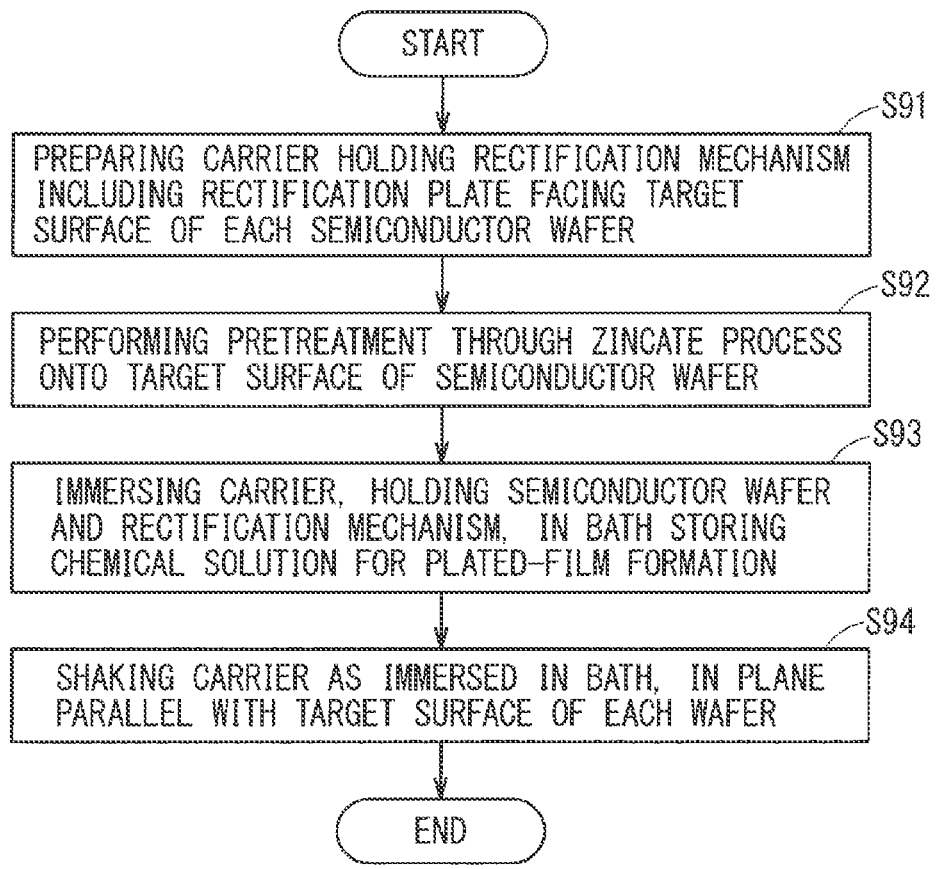
FIG. 8 is a flowchart showing the detailed process steps in the method for manufacturing the semiconductor device through electroless plating, according to the first preferred embodiment.

Step S9 is forming plated films containing Ni onto the front-surface metal film 3 and the back-surface metal film 7 through electroless plating. Hereinafter, the plated film containing Ni is referred to as a Ni plated film. FIG. 8 is a flowchart showing the detailed process steps in the method for manufacturing the semiconductor device through electroless plating, according to the first preferred embodiment. Herein, a zincate process is applied. Moreover, the Al alloys contained in the front-surface metal film 3 and the back-surface metal film 7 are replaced with Zn, thus depositing Zn; then the Ni plated films are formed from Zn as deposited.

Figure 9:
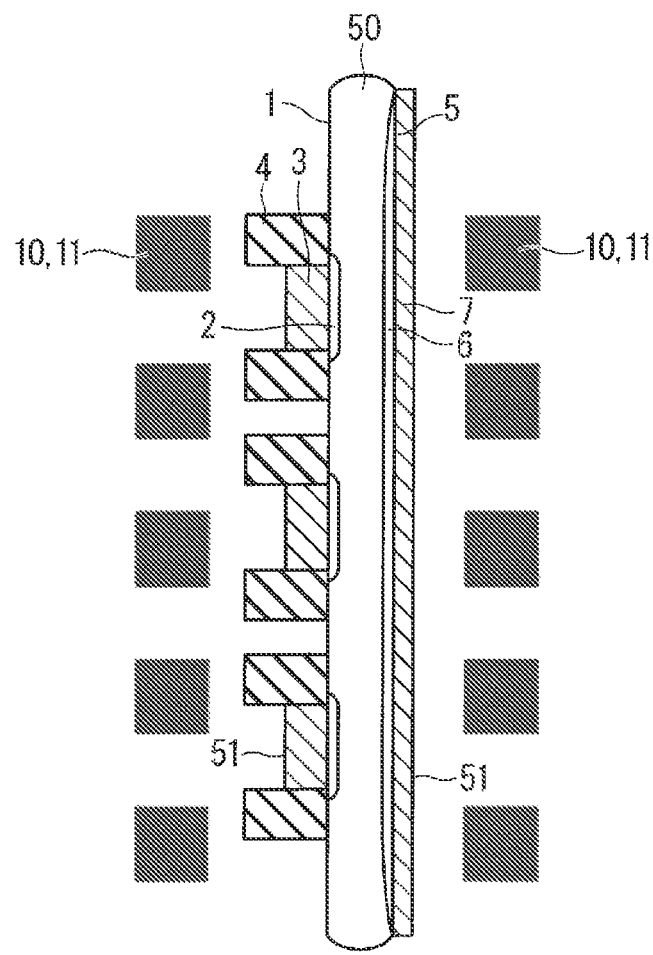
FIG. 9 is a cross-sectional view of the configuration of the semiconductor wafer and rectification mechanism according to the first preferred embodiment.

Step S91 is preparing the carrier 40 that holds the rectification mechanism 10, which includes the rectification plate 11 facing the target surface 51 of each semiconductor wafer 50. That is, the carrier 40 is prepared that holds the plurality of semiconductor wafers 50 and the rectification mechanism 10. At this stage, the rectification plate 11 of the rectification mechanism 10 faces the target surface 51 of each semiconductor wafer 50. In the first preferred embodiment, the front-surface metal film 3 and the back-surface metal film 7 are the target surfaces 51. FIG. 9 is a diagram of the configuration of the semiconductor wafer 50 and the rectification mechanism 10. The respective two rectification plates 11 face the front surface 1 and back surface 5 of the semiconductor wafer 50. Herein, the two rectification plates 11 are parallel with the respective target surfaces 51 of the semiconductor wafer 50. Moreover, the rectification plates 11 of the rectification mechanism 10 and the semiconductor wafers 50 are alternately arranged, as illustrated in FIG. 1. This enables the plurality of semiconductor wafers 50 to undergo plating en bloc, thereby improving productivity.

Step S92 is performing a pretreatment through a zincate process onto the target surfaces 51 of the semiconductor wafer 50. Firstly, the semiconductor wafer 50, held by the carrier 40, is immersed in an alkaline degreasing solution. This degreasing treatment removes grease and organic matters adhering to the target surfaces 51. Then, the semiconductor wafer 50 undergoes etching in an alkaline etching solution, followed by cleaning in an acid cleaning solution. The cleaning with acid removes oxides on the target surfaces 51, and at the same time, roughens the target surfaces 51. The rough target surfaces 51 enhance the reactivity in the subsequent zincate process, thus improving the adhesion between the target surfaces 51 and the Ni plated films. Next, the semiconductor wafer 50, held by the carrier 40, is immersed in an alkaline solution for zincate process. This zincate process replaces the Al alloys on the front-surface metal film 3 and the back-surface metal film 7, which are the target surfaces 51, with Zn, thus depositing Zn. Then, the semiconductor wafer 50 is immersed in nitric acid. Zn, deposited on the target surfaces 51, is removed. The semiconductor wafer 50 is again immersed in the alkaline solution for zincate process, thus replacing Al with Zn for Zn deposition. Such a double-zincate process deposits fine Zn on the target surfaces 51. This enhances the homogeneity of the Ni plated films to be formed through the subsequent plating process. The zincate process is preferably done twice or more times. Nevertheless, the zincate process is preferably done approximately three times at most, in view of the productivity.

Step S93 is immersing the carrier 40, holding the plurality of semiconductor wafers 50 and the rectification mechanism 10, in the bath 20, storing the chemical solution 21 for plated-film formation. The chemical solution 21 is an acid electroless-Ni-plating solution for forming the Ni plated films.

Step S94 is shaking the carrier 40 as immersed in the bath 20, in a plane parallel with the target surfaces 51 of each semiconductor wafer 50. The shaking is performed by the driver 30. At this stage, the semiconductor wafer 50 and the rectification mechanism 10 are held by the carrier 40 in such a manner that the semiconductor wafer 50 and the plurality of through-holes 12 establish a constant, relative positional relationship. That is, the carrier 40 is shaken with the relative positional relationship between each semiconductor wafer 50 and the plurality of through-holes 12 kept constant.

The electroless plating in steps S93 and S94 forms the Ni plated films on the target surfaces 51. During the process steps, Zn is firstly replaced with Ni, thus depositing Ni. Then, a reducing agent contained in the electroless-Ni-plating solution reduces and deposits Ni on the target surfaces 51. Electroless plating facilitates forming a thick metal film having a thickness of the order of several micrometers. Herein, the Ni plated films each preferably has a thickness of 2 to 10 μm, in view of a stress applied to the films after formation, and other things. The plated films formed through electroless plating are deposited on the metal films on which electrons are transmittable and receivable, but are not deposited on the protective film 4 on which electrons, such as polyimide electrons, are not transmitted and received. That is, the electroless plating enables selective formation of the plated films. This facilitates process, thus improving the productivity.

During the Ni deposition process, the driver 30 shakes the semiconductor wafer 50 placed in the carrier 40 in the plane parallel with the target surfaces 51 of the semiconductor wafer 50. Here, the driver 30 shakes the semiconductor wafer 50 in such a manner that the carrier 40 moves in circle in the plane parallel with the target surfaces 51. The rotation speed of the circular motion is preferably 10 to 60 rpm. Shaking the carrier 40 voluntarily produces the flow of the electroless-plating solution in the target surfaces 51. Moreover, the rectification mechanism 10 regulates the flow rate of the electroless-plating solution flowing through the front surface 1 of the semiconductor wafer 50. The flow rate can be regulated by a change in the shape or size of the through-holes 12 of the rectification plate 11. In the first preferred embodiment, the rectification mechanism 10 renders the electroless-plating solution, flowing through the front surface 1 of the semiconductor wafer 50, homogeneous. The rectification mechanism 10 also diffuses the electroless-plating solution and promotes the homogeneity of its concentration. This improves the thickness homogeneity of the Ni plated films within the plane of the semiconductor wafer 50, or between the semiconductor wafers 50, held by the carrier 40.

The Ni plated films are formed through step S91 to S94, included in step S9, followed by step S10 illustrated in FIG. 3.

Figure 10:
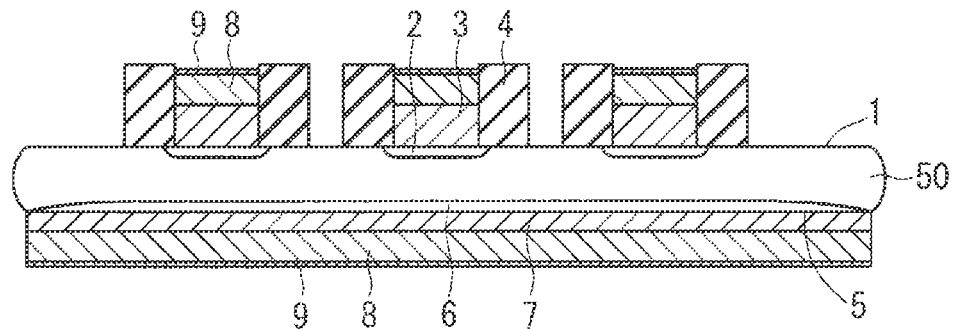
FIG. 10 is a cross-sectional view of the configuration of the semiconductor wafer on which Ni plated films and Au plated films are formed.

Step S10 is forming Au plated films on the Ni plated films through electroless plating. The carrier 40, holding the plurality of semiconductor wafers 50 and the rectification mechanism 10, is immersed in a bath. The bath stores a chemical solution that is a neutral electroless-Au-plating solution for forming the Au plated films. FIG. 10 is a cross-sectional view of the configuration of the semiconductor wafer 50 on which the Ni plated films, 8, and the Au plated films, 9. The Au plated films 9 prevent the Ni plated films 8 from oxidation. The Au plated films 9 each have a thickness of 20 to 100 nm. FIG. 11 is a table showing a process condition used in the foregoing individual steps.

(Effect)

A comparison in in-plane homogeneity of the thickness of the Ni plated films 8 was made in the following manner. The Ni plated films 8 were formed under the process condition in FIG. 11. Then, the comparison was made between a configuration without the rectification mechanism 10, and a configuration in which the rectification mechanism 10 was provided and the carrier 40 was shaken. For the configuration without the rectification mechanism 10, the in-plane homogeneity of the Ni plated film 8 on the front-surface metal film 3 was a coefficient of variance (CV)=9.7%; and the in-plane homogeneity of the Ni plated film 8 on the back-surface metal film 7, a CV=12.7%. For the configuration in which the rectification mechanism 10 was provided and the carrier 40 was shaken, the in-plane homogeneity of the Ni plated film 8 on the front-surface metal film 3 was a CV=6.5%; and the in-plane homogeneity of the Ni plated film 8 on the front-surface metal film 7, a CV=6.0%. The comparison has revealed that the rectification mechanism 10 achieves a Ni plated film with high in-plane homogeneity.

The semiconductor-manufacturing apparatus according to the first preferred embodiment forms the plated films on the target surfaces 51 of the plurality of wafers held by the carrier 40 capable of holding the plurality of wafers. The semiconductor-manufacturing apparatus includes the following: the rectification mechanism 10 including the rectification plate 11 having the plurality of through-holes 12, the rectification mechanism 10 being held by the carrier 40 in such a manner that the rectification plate faces the target surface 51 of each wafer; the bath 20 in which the chemical solution 21 for forming the plated film is stored, and in which the carrier 40, holding the plurality of wafers and the rectification mechanism 10, is immersed in the chemical solution 21; and the driver 30 configured to shake the carrier 40 as immersed in the bath 20 with the relative positional relationship between each wafer and the plurality of through-holes 12 kept constant. Each wafer in the first preferred embodiment is the semiconductor wafer 50.

The rectification mechanism 10 in the semiconductor-manufacturing apparatus enhances the homogeneity of the flow rate of the plating solution flowing through the front surface 1 of the target surface 51, and diffuses the plating solution, thereby promoting the homogeneity of its concentration. This forms a plated film having a highly homogeneous thickness on the target surface 51.

The driver in the semiconductor-manufacturing apparatus according to the first preferred embodiment shakes the carrier 40 in the direction parallel with the target surface 51 of each wafer.

The semiconductor wafer 50 and the rectification mechanism 10 are shaken in the direction parallel with the target surface 51, thereby voluntarily producing the flow of the chemical solution 21 all over the semiconductor wafer 50. This improves the thickness homogeneity of the plated film to be formed. The direction parallel with the target surface 51 includes one direction and the circumferential direction. The carrier 40 is shaken in the circumferential direction, thereby further improving the thickness homogeneity of the plated film.

The method for manufacturing the semiconductor device according to the first preferred embodiment forms the plated films on the target surfaces 51 of the plurality of wafers held by the carrier capable of holding the plurality of wafers. The method includes the following: preparing the carrier 40 holding the rectification mechanism 10 that includes the rectification plate 11 having the plurality of through-holes 12, the rectification plate 11 being provided to face the target surface 51 of each wafer; immersing the carrier 40, which holds the plurality of wafers and the rectification mechanism 10, in the chemical solution 21 for forming each plated film, the chemical solution 21 being stored in the bath 20; and shaking the carrier 40 as immersed in the bath 20 with the relative positional relationship between each wafer and the plurality of through-holes 12 kept constant, to form the plated film on the target surface 51.

According to the method, the rectification mechanism 10 enhances the homogeneity of the flow rate of the plating solution flowing through the front surface 1 of the target surface 51, and diffuses the plating solution, thereby promoting the homogeneity of its concentration. This forms a plated film having a highly homogeneous thickness on the target surface 51.

In the method according to the first preferred embodiment, the direction in which the carrier 40 is shaken is parallel with the target surface 51 of each wafer.

The semiconductor wafer 50 and the rectification mechanism 10 are shaken in the direction parallel with the target surface 51, thereby voluntarily producing the flow of the chemical solution 21 all over the semiconductor wafer 50. This improves the thickness homogeneity of the plated film to be formed. The direction parallel with the target surface 51 includes one direction and the circumferential direction. The carrier 40 is shaken in the circumferential direction, thereby further improving the thickness homogeneity of the plated film.

The method according to the first preferred embodiment includes before preparing the carrier 40, which holds the plurality of wafers and the rectification mechanism 10, purifying the target surface 51 of each wafer with plasma.

According to the method, purifying the entire target surface 51 enhances the wettability between the target surface 51 and the plating solution. This promotes a uniform replacement reaction, thereby forming a plated film having a highly homogeneous thickness.

In the method according to the first preferred embodiment, the plasma contains oxygen or argon.

Oxygen plasma has an oxidation capability. Argon plasma has an etching capability. Hence, the method efficiently removes contaminated substances adhering to the target surface 51.

In the method according to the first preferred embodiment, the plated film is formed through electroless plating. The method improves the productivity.

Modification of First Preferred Embodiment

Figure 12:
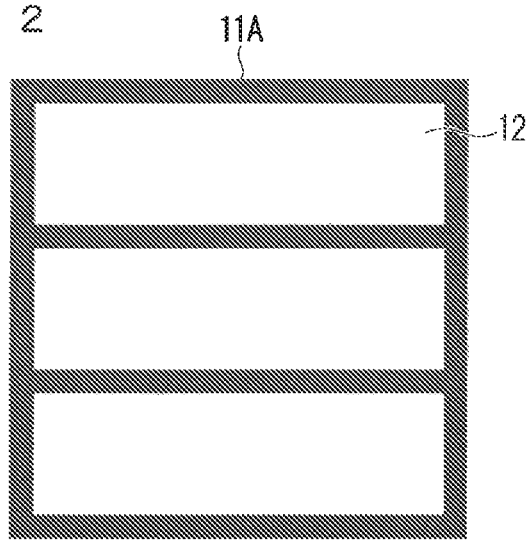
FIGS. 12 to 14 are diagrams of the configuration of rectification plates of a rectification mechanism according to a modification of the first preferred embodiment.
Figure 13:
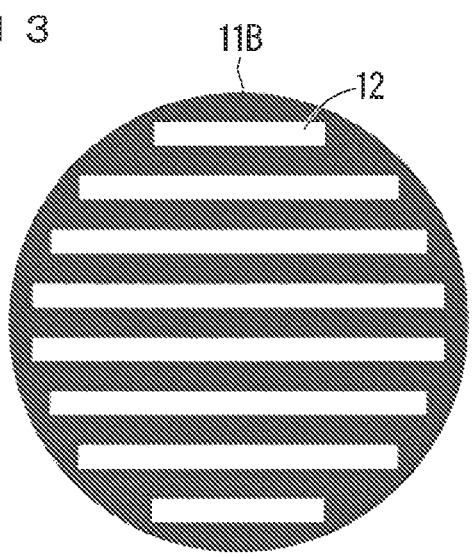
Figure 14:
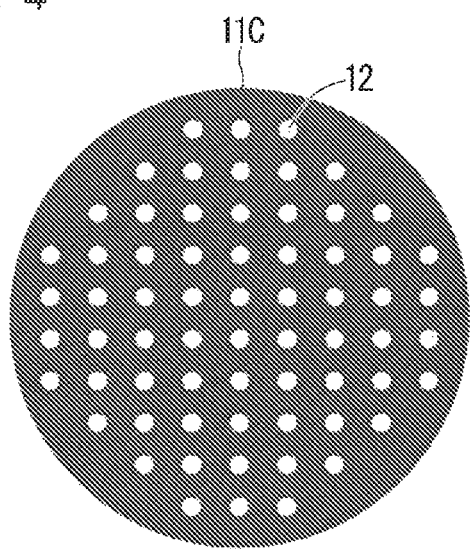

The rectification mechanism 10 may be configured in any manner other than the configuration described in the first preferred embodiment. The rectification mechanism 10, although being integrated with the carrier 40 in FIG. 2, may be attachable to and detachable from the carrier 40. FIGS. 12 to 14 are diagrams of different configuration of the rectification plate 11. Further, FIGS. 12 to 14 each illustrate a rectification plate detached from the carrier 40.

The through-hole 12 of the rectification plate, 11A, in FIG. 12 has a greater opening than the through-hole 12 of the rectification plate 11 in FIG. 3. The rectification plate 11, although being a rectangle in outer shape in the first preferred embodiment, may be a circle in outer shape such as the rectification plate, 11B, as illustrated in FIG. 13. The through-hole 12 of the rectification plate, 11C, may be a circle as illustrated in FIG. 14. A rectification plate is selected according to the opening pattern or area of the target surface 51, and is placed in the carrier 40. This improves the homogeneity of the plated film.

Figure 15:
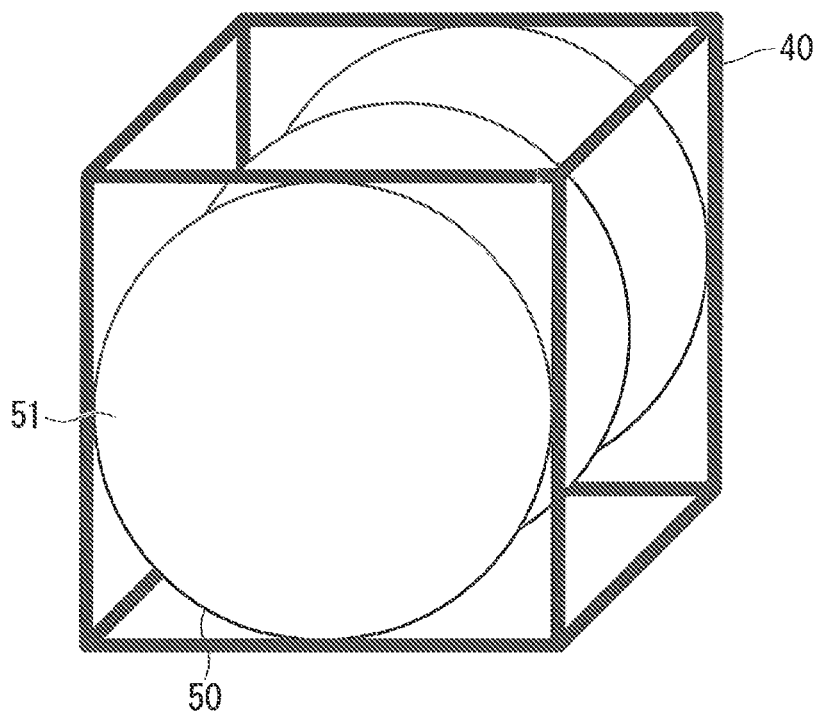
FIG. 15 is a diagram of the carrier holding the semiconductor wafer according to the modification of the first preferred embodiment.
Figure 16:
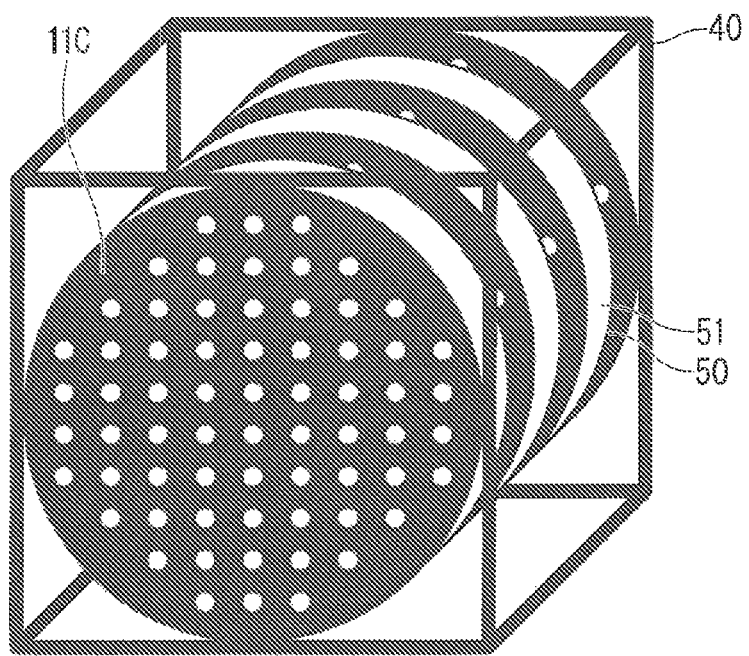
FIG. 16 is a diagram of the carrier holding the rectification mechanism that includes the rectification plate according to the modification of the first preferred embodiment.

FIG. 15 is a diagram of the carrier 40 holding the semiconductor wafers 50. FIG. 16 is a diagram of the carrier 40 holding the rectification mechanism 10 having the rectification plates 11C, illustrated in FIG. 14. Each rectification plate 11C is placed in the carrier 40 so as to face the target surface 51 of each semiconductor wafer 50. That is, the rectification plates 11C and the semiconductor wafers 50 are alternately arranged. The carrier 40 holds the rectification mechanism 10 including the rectification plates 11C. At this stage, each semiconductor wafer 50 and the rectification mechanism 10 are held by the carrier 40 in such a manner that each semiconductor wafer 50 and each through-hole 12 establish a constant, relative positional relationship.

The semiconductor-manufacturing apparatus achieves an effect similar to that in the first preferred embodiment when the apparatus includes the attachable and detachable rectification mechanism 10 held by the carrier 40. The rectification mechanism 10 is detachable from the carrier 40, thereby enabling the use of a commercially available carrier. This reduces investment cost.

Second Preferred Embodiment

FIG. 17 is a graph showing a relationship between the rotation speed of shaking and the thickness homogeneity (CV) of a plated film. The configuration of a semiconductor-manufacturing apparatus according to a second preferred embodiment is similar to that according to the first preferred embodiment. As illustrated in FIG. 17, the carrier 40, holding the semiconductor wafers 50 and the rectification mechanism 10, rotates. That is, the carrier 40 is shaken in circular motion. This improves the in-plane homogeneity of the thickness of Ni plated films. The homogeneity improves, particularly in a rotation speed of 15 to 60 rpm.

As such, the carrier 40, holding the semiconductor wafers 50 and the rectification mechanism 10, rotates when the plated films is formed. That is, the carrier 40 is shaken in circular motion. This forms a Ni plated film having high in-plane homogeneity.

It is noted that in the present invention, the individual embodiments can be freely combined, or can be modified and omitted as appropriate, within the scope of the invention.

While the invention has been shown and described in detail, the foregoing description is in all aspects illustrative and not restrictive. It is therefore understood that numerous modifications and variations can be devised without departing from the scope of the invention.

What is claimed is:

1. A semiconductor-manufacturing apparatus forming plated films on target surfaces of a plurality of wafers held by a carrier capable of holding the plurality of wafers, the semiconductor-manufacturing apparatus comprising:
    a rectification mechanism including a plurality of rectification plates, each of the rectification plates provided with a plurality of through-holes, the rectification mechanism being held by the carrier in such a manner that each of the rectification plates faces a respective wafer;
    a bath in which a chemical solution for forming each plated film is stored, and in which the carrier, holding the plurality of wafers and the rectification mechanism, is immersed in the chemical solution; and
    a driver configured to shake the carrier as immersed in the bath with a relative positional relationship between each wafer and the plurality of through-holes kept constant.

2. The semiconductor-manufacturing apparatus according to claim 1, wherein a direction in which the driver is configured to shake the carrier is parallel with the target surface of each wafer.

3. A method for manufacturing a semiconductor device, the method forming plated films on target surfaces of a plurality of wafers held by a carrier capable of holding the plurality of wafers, the method comprising:
    preparing the carrier holding a rectification mechanism that includes a plurality of rectification plates, each of the rectification plates provided with a plurality of through-holes and each of the rectification plates being provided to face a respective wafer;
    immersing the carrier, which holds the plurality of wafers and the rectification mechanism, in a chemical solution for forming each plated film, the chemical solution being stored in a bath; and
    shaking the carrier as immersed in the bath with a relative positional relationship between each wafer and the plurality of through-holes kept constant, to form the plated films on the target surfaces.

4. The method for manufacturing a semiconductor device according to claim 3, wherein a direction in which the carrier is shaken is parallel with the target surface of each wafer.

5. The method for manufacturing a semiconductor device according to claim 3, comprising before preparing the carrier, which holds the plurality of wafers and the rectification mechanism, purifying the target surface of each wafer with plasma.

6. The method for manufacturing a semiconductor device according to claim 5, wherein the plasma contains oxygen or argon.

7. The method for manufacturing a semiconductor device according to claim 3, wherein each plated film is formed through electroless plating.

\* \* \* \* \*